(12) United States Patent
Motoi et al.

(10) Patent No.: US 7,026,095 B2
(45) Date of Patent: Apr. 11, 2006

(54) PHOTOSENSITIVE PLATE

(75) Inventors: Keiichi Motoi, Ohtsu (JP); Hajime Koda, Ohtsu (JP); Satoshi Takahashi, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 10/405,031

(22) Filed: Apr. 2, 2003

(65) Prior Publication Data

US 2003/0235780 A1 Dec. 25, 2003

(30) Foreign Application Priority Data

| Apr. 2, 2002 | (JP) | ............................. 2002-099615 |
| Apr. 2, 2002 | (JP) | ............................. 2002-099616 |
| Feb. 28, 2003 | (JP) | ............................. 2003-053968 |

(51) Int. Cl.
*G03F 7/11* (2006.01)

(52) U.S. Cl. .............................. 430/273.1; 430/271.1; 430/281.1

(58) Field of Classification Search ................ 430/138, 430/270.1, 271.1, 273.1, 281.1
See application file for complete search history.

(56) References Cited

U.S. PATENT DOCUMENTS

| 5,039,592 | A | | 8/1991 | Umeda ........................ 430/271 |
| 5,888,697 | A | * | 3/1999 | Fan .......................... 430/273.1 |
| 6,479,215 | B1 | * | 11/2002 | Haraguchi et al. ....... 430/273.1 |
| 6,521,390 | B1 | * | 2/2003 | Leinenbach et al. ..... 430/273.1 |
| 6,646,022 | B1 | * | 11/2003 | Okazaki et al. ............. 522/153 |
| 2002/0037475 | A1 | * | 3/2002 | Taguchi et al. .......... 430/273.1 |
| 2003/0082482 | A1 | * | 5/2003 | Wada et al. ............. 430/273.1 |
| 2003/0148217 | A1 | * | 8/2003 | Komatsu et al. ......... 430/273.1 |
| 2003/0235704 | A1 | * | 12/2003 | Akatsu et al. ............... 428/482 |

FOREIGN PATENT DOCUMENTS

| EP | 0 275 147 A | 7/1988 |
| WO | WO 99/28788 A1 * | 6/1999 |

OTHER PUBLICATIONS

EP Search Report—EP 03 00 7590.

* cited by examiner

*Primary Examiner*—Barbara L. Gilliam
(74) *Attorney, Agent, or Firm*—Morrison & Foerster LLP

(57) ABSTRACT

The present invention provides a photosensitive plate having a support, and a photosensitive resin layer, a coating layer and a cover film successively laminated on the support, wherein the aforementioned coating layer contains an actinic ray absorbent having an absorption wavelength, which falls in the wavelength area of actinic rays absorbed by the photosensitive resin layer, and an average molecular weight of not less than 1,000.

5 Claims, No Drawings

PHOTOSENSITIVE PLATE

TECHNICAL FIELD OF THE INVENTION

The present invention relates to a photosensitive plate used for producing a relief printing plate.

BACKGROUND OF THE INVENTION

Generally, a photosensitive plate to be used for relief printing plate consists of a support layer, a photosensitive resin composition layer, a coating layer and a cover film, and the cover film is removed when in use.

It is widely known that a relief printing plate can be prepared by exposing a photosensitive plate, from which a cover film has been removed, to actinic rays through a negative film (or positive film) having a transparent image part to cure a photosensitive resin layer of the exposed part, and removing a photosensitive resin layer of a non-exposed part by dissolving with a suitable solvent.

The recent request for a photosensitive plate to be used for a relief printing plate is directed to the reproduction of more micro-patterns, and a fine printing relief having a line width of void pattern of about 30 μm has been demanded. However, a relief printing plate material using a photosensitive resin composition cannot meet the request sufficiently and a photosensitive plate capable of reproducing fine patterns in plate making and printing has not been obtained heretofore. The present inventors have found that a coating layer of a photosensitive plate is involved in the reproducibility of fine pattern in plate making and printing. However, simultaneous achievement of the releaseability of a cover film during plate making and reproducibility of fine pattern in plate making and printing has been difficult.

SUMMARY OF THE INVENTION

The present invention aims at solving the above-mentioned problems and provides a photosensitive plate showing fine releaseability of a cover film during plate making and superior reproducibility of fine pattern in printing.

As a result of the intensive studies made by the present inventors in an attempt to solve the aforementioned problems, it has been found that, by improving a coating layer of a photosensitive plate, releaseability of a cover film during plate making and reproducibility of fine pattern in printing can be satisfied, based on which the present invention has been completed.

Accordingly, the present invention provides the following.
(1) A photosensitive plate comprising a support, and a photosensitive resin layer, a coating layer and a cover film successively laminated on said support, wherein the aforementioned coating layer comprises an actinic ray absorbent having an absorption wavelength, which falls in the wavelength area of actinic rays absorbed by the photosensitive resin layer, and an average molecular weight of not less than 1,000.
(2) The photosensitive plate of the above-mentioned (1), wherein the actinic ray absorbent comprises a UV-absorbing microparticle having an average particle size of 1 nm–500 nm.
(3) The photosensitive plate of the above-mentioned (2), wherein the UV-absorbing microparticle is obtained by emulsion polymerization of a UV absorbent.
(4) The photosensitive plate of the above-mentioned (1), wherein the coating layer has a thickness of not more than 1 μm, and a peel force between the coating layer and the cover film is 1 g/cm–100 g/cm.
(5) The photosensitive plate of the above-mentioned (1), wherein the coating layer has a light transmittance of 50%–99% of the light having a wavelength of 360 nm.

DETAILED DESCRIPTION OF THE INVENTION

The coating layer characteristic of the present invention is formed to prevent adhesion of a negative to the photosensitive resin layer, and sometimes referred to as a slip coat layer, a peeling layer, an anti-adhesive layer and the like. As a constituent material, polyamide, polyvinyl alcohol and derivatives thereof, cellulose polymer and the like are used as a binder. These may be used alone or two or more kinds thereof may be used in combination. A general coating layer may contain, besides the above-mentioned component, inorganic microparticles such as silica and the like, organic microparticles obtained by three dimensional internal crosslinking of polystyrene and acrylic monomer, surfactant, polyhydric alcohol and the like as necessary.

The actinic ray absorbent to be contained in the coating layer used for the present invention has an absorption wavelength which falls in the wavelength area of actinic rays absorbed by the photosensitive resin layer, and an average molecular weight of not less than 1,000, preferably not less than 5,000, more preferably not less than 10,000. When the average molecular weight is less than 1,000, the actinic ray absorbent moves into the photosensitive resin layer to undesirably degrade the actinic ray absorbability of the coating layer. In the present specification, the actinic ray means light having a wavelength of 250 nm–700 nm, particularly ultraviolet ray having a wavelength of 320 nm–400 nm.

As the actinic ray absorbent having an average molecular weight of not less than 1,000, one compatible with or capable of dispersing in, the constituent of the coating layer is preferable. Examples thereof include, but not limited to, particulate UV absorbents obtained by copolymerization by emulsion polymerization of a radically polymerizable compound such as acrylic acid ester, styrene and the like, and a radically polymerizable UV absorbent having a benzophenone structure or a benzotriazole structure; UV absorbent obtained by grafting of benzophenone or benzotriazole compound onto polyvinyl alcohol, cellulose polymer and the like via an epoxy compound; UV absorbent obtained by grafting of benzophenone or benzotriazole compound onto an oligomer compatible with the coating layer constituent, having active hydrogen on molecular terminal and having an average molecular weight of not less than 1,000, via diisocyanate; and the like.

In the present invention, the use is not limited to the aforementioned particulate UV absorbent, and the use of particulate actinic ray absorbents is preferable. Besides the aforementioned examples, inorganic UV-absorbing microparticles of, for example, titanium oxide and cerium oxide can be used. In view of the UV-absorbing effect, organic UV-absorbing microparticle is preferable, and UV-absorbing microparticle having a benzotriazole structure is particularly preferable.

The average particle size thereof is preferably 1 nm–500 nm, more preferably 1 nm–200 nm, particularly preferably 1 nm–100 nm. When it exceeds 500 nm, the gap between microparticles becomes wider to unpreferably degrade the UV absorbability of the coating layer. In the present specification, the average particle size of the UV-absorbing microparticle was measured according to a particle size distribution measurement method by laser diffraction scattering method using a light scattering spectrophotometer (PAR-3; manufactured by OTSUKA ELECTRONICS CO., LTD.).

In the present invention, moreover, the peel force between the coating layer and the cover film is preferably 1 g/cm–100 g/cm. To make the peel force fall within the above-mentioned range, for example, a surfactant is added to the coating layer. As the surfactant, one having a defoaming action during application of a coating layer and capable of reducing the peel force of a cover film is preferable. Examples thereof include, but not limited to, a silicone foam inhibitor, an amide foam inhibitor, a polyether foam inhibitor and modified foam inhibitors thereof.

The actinic ray transmittance of the coating layer of the present invention is preferably 50%–99%, more preferably 70–95%, still more preferably 80–90%, relative to the light having a wavelength of 360 nm. When it is less than 50%, the amount of actinic rays reaching the photosensitive resin layer is too small to degrade reproducibility of the relief, whereas when it exceeds 99%, the amount of actinic rays reaching the photosensitive resin layer becomes too large to unpreferably prevent reproduction of fine pattern.

To make the actinic rays transmittance of the coating layer fall within the above-mentioned range, for example, the content of the actinic ray absorbent in the coating layer is appropriately adjusted. While the content of the actinic ray absorbent varies depending on the kind thereof, it is, for example, preferably 0.1 wt %–30 wt %, more preferably 1 wt %–20 wt %, relative to the entire weight of the coating layer.

The thickness of the coating layer is preferably 0.1–10 μm, more preferably 0.1–2 μm, particularly preferably 0.1–1 μm, further desirably 0.1–0.8 μm, particularly 0.1–0.6 μm. When the thickness is smaller than 0.1 μm, it adheres to the negative, whereas when it exceeds 10 μm, the resolving power of relief becomes unpreferably smaller.

In the present invention, the photosensitive resin layer is a layer of a composition containing at least a known soluble synthetic polymer compound, a photopolymerizable unsaturated compound (hereinafter to be also referred to as a crosslinking agent) and a photoinitiator. In addition, it may contain an additive, such as plasticizer, thermal polymerization inhibitor, dye, pigment, UV absorbent, flavoring and antioxidant.

In the present invention, as a soluble synthetic polymer compound, a known soluble synthetic polymer compound can be used. For example, polyether amide (e.g., JP-A-55-79437 etc.), polyether ester amide (e.g., JP-A-58-113537 etc.), tertiary nitrogen atom-containing polyamide (e.g., JP-A-50-76055 etc.), ammonium salt type tertiary nitrogen atom-containing polyamide (e.g., JP-A-53-36555 etc.), addition polymer of amide compound having at least one amide bond and an organic diisocyanate compound (e.g., JP-A-58-140737 etc.), addition polymer of diamine without an amide bond and an organic diisocyanate compound (e.g., JP-A-4-97154 etc.) and the like can be used. Of these, a tertiary nitrogen atom-containing polyamide and ammonium salt type tertiary nitrogen atom-containing polyamide are preferable.

A preferable photopolymerizable unsaturated compound is a ring-opening addition reaction product of polyglycidyl ether of polyhydric alcohol, and methacrylic acid and acrylic acid. Examples of the aforementioned polyhydric alcohol include dipentaerythritol, pentaerythritol, trimethylol propane, glycerin, ethylene glycol, diethylene glycol, triethylene glycol, phthalic acid-ethylene oxide adduct, and the like. Of these, trimethylol propane is preferable.

Examples of the photoinitiator include benzophenones, benzoins, acetophenones, benzils, benzoin alkyl ethers, benzylalkyl ketals, anthraquinones, thioxanthones and the like. Specific examples thereof include benzophenone, chlorobenzophenone, benzoin, acetophenone, benzil, benzoin methylether, benzoin ethylether, benzoin isopropylether, benzoin isobutylether, benzyldimethylketal, benzyldiethylketal, benzyldiisopropylketal, anthraquinone, 2-ethylanthraquinone, 2-methylanthraquinone, 2-allylanthraquinone, 2-chloroanthraquinone, thioxanthone, 2-chlorothioxanthone and the like.

In the present invention, a cover film is formed to protect a photosensitive resin layer during storage and handling of the plate, and removed (peeled off) before irradiation of actinic rays. The peel force between the coating layer and the cover film then is preferably 1–100 g/cm, more preferably 3–100 g/cm, still more preferably 5–40 g/cm, as mentioned above. When the peel force of the cover film is less than 1 g/cm, peeling unpreferably occurs during the production step, whereas when it exceeds 100 g/cm, a peeling trace remains on the peeling layer during plate making, which prevents adhesion of the negative. The peel force is measured when the cover film is drawn in the direction forming an angle of 90° with the photosensitive resin layer at a tensile rate of 500 mm/min using a tensile testing machine (RTC-1210A manufactured by ORIENTEC CO., LTD.), and is expressed in the strength per unit width (cm).

The constituent materials of the cover film are preferably polyamide; polyvinyl alcohol; copolymer of ethylene and vinyl acetate; amphoteric interpolymer; cellulose polymer such as hydroxyalkylcellulose and cellulose acetate; polybutyral; cyclic rubber and the like. Here, the amphoteric interpolymer is described in U.S. Pat. No. 4,293,635. Any single kind of these materials may be used alone or a combination of two more kinds thereof may be used. In addition, an auto-oxidizable compound of, for example, nitrocellulose and nitroglycerin; nonauto-oxidizable polymer such as alkylcellulose (e.g., ethylcellulose), polyacrylic acid and alkaline metal salt thereof; polyacetal; polyimide; polycarbonate; polyester; polyalkylene such as polyethylene and polybutylene; polyphenylene ether; polyethylene oxide; polylactone and combinations thereof; and the like can be used.

The thickness of the cover film is preferably 10–300 μm, particularly preferably 10–200 μm. When the thickness is less than 10 μm, the cover film gets broken when peeling off the film, whereas when it exceeds 300 μm, handling performance of waste after peeling becomes unpreferably poor.

As the support to be used in the present invention, a plastic film such as polyester film and the like, a metal plate such as iron, stainless, aluminum and the like, a metal-deposited film and the like can be used. The thickness of the support can be determined according to the use thereof. Where necessary, the adhesion between the support and the photosensitive resin layer may be improved by applying a known adhesive conventionally used for this kind of purpose to the surface.

While the method for preparing the photosensitive plate of the present invention is not particularly limited, generally, a photosensitive resin layer is formed on a support by coating, spray coating and the like, or a protecting film is peeled off from a commercially available photosensitive printing plate, thereby to give one laminate. Separately, a coating layer is formed on a substrate film (cover film) by coating, spray coating and the like to give a different laminate, and the resulting two laminates are laminated using a heat press machine and the like. The laminating conditions are temperature: room temperature— 150° C., preferably 50–120° C., pressure: 20–200 kg-weight/cm$^2$, preferably 50–150 kg-weight/cm$^2$. The photosensitive plate of the present invention can be processed into a sheet having a desired thickness by an optional known method such as heat press, casting, melt extrusion, solution cast and the like.

In the photosensitive plate of the present invention, a negative film or a positive film having transparent image parts is placed on the photosensitive resin layer to form an adhesion state, and actinic rays are irradiated from above for exposure to the light, thereby curing and insolubilizing the exposed part. As a light source of the actinic rays, a high pressure mercury lamp, an ultra-high pressure mercury lamp, a metal halide lamp, a xenon lamp, a chemical lamp and the like, which generally emit light having a wavelength of 300–400 nm, can be used.

After exposure to the light, the non-exposed part is dissolved and removed using a suitable solvent, preferably water, particularly neutral water, for rapid development in a short time, whereby a printing plate (relief plate) can be obtained. For development, a spray developer, a brush developer and the like are preferably used.

The present invention is explained in more detail in the following by referring to Examples, which are not to be construed as limitative. In the Examples, a simple "part" means "part by weight".

EXAMPLE 1

ε-Caprolactam (55.0 parts), N,N'-bis(γ-aminopropyl)piperazine adipate (40.0 parts), 1,3-bisaminomethylcyclohexane adipate (7.5 parts) and water (100 parts) were placed in a reactor, and after sufficient nitrogen substitution, sealed and gradually heated. From the time point when the internal pressure reached 10 kg/cm$^2$, water in the reactor was gradually distillated to bring to normal pressure in an hour, after which the mixture was reacted for 1.0 hr at normal pressure. The highest polymerization temperature was 220° C. Transparent pale-yellow polyamide having a melting point of 140° C. and a specific viscosity of 2.00 was obtained.

The obtained polyamide (50.0 parts), N-ethyltoluenesulfonamide (5.0 parts), 1,4-naphthoquinone (0.03 part), methanol (50.0 parts) and water (10 parts) were mixed in a dissolution apparatus equipped with a stirrer at 60° C. for 2 hr to completely dissolve the polymer. Then, bisphenol A diglycidyl ester—acrylic acid adduct (40.6 parts), methacrylic acid (2.9 parts), hydroquinone monomethylether (0.1 part), ammonium sulfite (0.3 part), oxalic acid (0.1 part) and benzyl dimethyl ketal (1.0 part) were added and the mixture was dissolved in 30 min. The temperature was gradually raised to allow distillation of methanol and water, and the residue was concentrated until the temperature in a distillation still reached 110° C. At this stage, a fluidic viscous photosensitive resin was obtained.

Then, a polyester film having a total thickness of 270 μm, which comprised an adhesive layer having a thickness of 20 μm formed on a polyethylene terephthalate support having a thickness of 250 μm was prepared.

The composition solution for the adhesive layer was prepared as follows using a polyesterurethane adhesive. A polyester resin "VYLON RV-200" (80 parts by weight, manufactured by Toyo Boseki Kabushiki Kaisha) was dissolved by heating in a mixed solvent (1940 parts by weight) of toluene/methyl ethyl ketone=80/20 (weight ratio) at 80° C. After cooling, isocyanurate polyhydric isocyanate ("DESMODULE HL", 20 parts by weight, manufactured by SUMITOMO BAYER URETHANE CO., LTD.) obtained using hexamethylene diisocyanate and toluene diisocyanate as starting materials was added and triethylenediamine (0.06 part by weight) was added as a curing catalyst, and the mixture was stirred for 10 min.

A solution of composition for adhesive layer thus obtained was applied to a 250 μm thick polyethylene terephthalate film such that the film thickness was 20 μm, and dry cured at 120° C. for 3 min to give a support having an adhesive layer.

The photosensitive resin obtained above was cast on the adhesive layer of this support to form a photosensitive resin layer.

Separately, an aqueous solution of polyvinyl alcohol (blend of GOHSENOL AH-26 manufactured by NIPPON SYNTHETIC CHEMICAL INDUSTRY CO., LTD and GOHSENOL GH-23 at a weight ratio of 35:65)/UV-absorbing emulsion (New Coat UVA-204W manufactured by SHIN-NAKAMURA CHEMICAL CO., LTD., average molecular weight about 100,000, average particle size 60–70 nm)/pure water=4.4 parts/3.3 parts/92.3 parts was applied to a polyester film (cover film, whole cloth was E5000 manufactured by Toyo Boseki Kabushiki Kaisha, thickness 100 μm) matte treated by chemical etching, with a bar coater #8 and dried at 100° C. for 3 min to form a coating layer having a thickness of 0.5 μm after drying. The light transmittance of the coating layer at a wavelength of 360 nm was 80%. This light transmittance was measured using a U-3210 type recording spectrophotometer (manufactured by Hitachi, Ltd.). A 100 μm thick polyester film having this coating layer was laminated on a photosensitive resin layer of the support prepared above using a laminator, such that the coating layer side came into contact with the photosensitive resin layer of the support prepared above, whereby a laminate sheet having a total thickness of 1050 μm and a thickness of the photosensitive resin layer of 680 μm was obtained. This laminate was solidified in a plate under preservation at 30° C. After 24 hr, this laminate was heated at 103° C. for 3 min, and stored for at least 7 days to give a photosensitive plate (undeveloped plate). The peel force of the cover film of this plate was 20 g/cm.

The reproducibility evaluation of fine void pattern was performed as follows. A polyester film (cover film, thickness 100 μm) was peeled off to allow vacuum adhesion of a test negative film, which was exposed to light using a printer for A2 size (manufactured by NIHON DENSHI SEIKI CO., LTD., chemical lamp manufactured by Mitsubishi) for 10 min to give a sample. Then the sample was developed using tap water as a liquid developer and a brush type washer (140 μmφ nylon brush, JW-A2-PD type manufactured by NIHON DENSHI SEIKI CO., LTD.) at 25° C. for 2 min to give a relief image. After drying with hot air at 70° C. for 10 min, it was exposed using a printer for A2 size (manufactured by NIHON DENSHI SEIKI CO., LTD.) for 3 min to give a relief plate.

As a result of the evaluation of the reproducibility of the void pattern of the obtained photosensitive plate, it was found that a light shielding pattern of the negative film had a slit width of 30 μm, and the width of a relief concave part was also reproduced to be 30 μm, thereby faithfully reproducing the pattern of the negative film.

Using this relief plate, printability of 30 μm void pattern was evaluated. As a result of the printing test using a seal printing machine P-20 manufactured by SANJO MACHINE WORKS, LTD. and black ink (T&K, UV BESTCURE No5

BF ink), a printed matter having a 30 μm void pattern free of filling with ink, which was a sharp copy in sheets, was obtained.

Comparative Example 1

In the same manner as in Example 1 except that a UV-absorbing emulsion was not added to a coating layer, a photosensitive plate was obtained. The light transmittance of the coating layer of the obtained plate at a wavelength of 360 nm was 100%. The peel force of the cover film of this plate was 120 g/cm.

As a result of the evaluation of the reproducibility of the void pattern of the obtained photosensitive plate, it was found that a light shielding pattern had a slit width of 30 μm, and the width of a relief concave part was 20 μm, this failing to reproduce the pattern of the negative film. Then using this relief plate, printability of 30 μm void pattern was evaluated in the same manner as in Example 1. As a result, ink adhered to the part that should be void and a sharp copy in sheets was not obtained.

Comparative Example 2

In the same manner as in Example 1 except that a coating layer was formed on the cover film as mentioned below, a photosensitive plate was obtained. The peel force of the cover film of the obtained plate was 120 g/cm.

An aqueous solution of polyvinyl alcohol (blend of GOHSENOL AH-26 manufactured by NIPPON SYNTHETIC CHEMICAL INDUSTRY CO., LTD and GOHSENOL GH-23 at a weight ratio of 35:65)/UV absorbent having an average molecular weight of 323 (RUVA-93, manufactured by Otsuka Chemical Co., Ltd.)/pure water=4.7 parts/0.6 part/95 parts was applied to a polyester film (cover film, whole cloth was E5000 manufactured by Toyo Boseki Kabushiki Kaisha, thickness 100 μm) matte treated by chemical etching, with a bar doater #8 and dried at 100° C. for 3 min to form a coating layer having a thickness of 0.5 μm after drying. The light transmittance of the coating layer at a wavelength of 360 nm was 80%.

As a result of the evaluation of the reproducibility of the fine void pattern of the obtained photosensitive plate, it was found that a light shielding pattern had a slit width of 30 μm, and the width of a relief concave part was 20 μm, this failing to reproduce the pattern of the negative film. Then using this relief plate, printability of 30 μm void pattern was evaluated in the same manner as in Example 1. As a result, ink adhered to the part that should be void and a sharp copy in sheets was not obtained.

EXAMPLE 2

In the same manner as in Example 1 except that a plane polyester film (whole cloth was E5000 manufactured by Toyo Boseki Kabushiki Kaisha, thickness 125 μm) was used as a cover film, a photosensitive plate was obtained. The peel force of the cover film of the obtained plate was 40 g/cm and releaseability was fine. The light transmittance of the coating layer of the obtained plate at a wavelength of 360 nm was 80%.

As a result of the evaluation of the reproducibility of the void pattern of the obtained photosensitive plate, it was found that a light shielding pattern had a slit width of 30 μm, and the width of a relief concave part was also 30 μm, thereby faithfully reproducing the pattern of the negative film. Then, using this relief plate, printability of a void pattern was evaluated in the same manner as in Example 1. As a result, a printed matter having a void pattern free of filling with ink, which was a sharp copy in sheets, was obtained.

As mentioned above, according to the photosensitive plate of the present invention having such constitution, a printing plate, which shows fine cover film-release property, can reproduce fine void pattern in a relief and a printed matter, and which affords high grade printing, can be obtained, thereby greatly contributing to the industries.

This application is based on patent application Nos. 2002-99616, 2002-99615 and 2003-53968 filed in Japan, the contents of which are hereby incorporated by reference.

What is claimed is:

1. A photosensitive plate comprising a support, and a photosensitive resin layer, a coating layer and a cover film successively laminated on said support, wherein said coating layer comprises an actinic ray absorbent having an absorption wavelength, which falls in the wavelength area of actinic rays absorbed by the photosensitive resin layer, and an average molecular weight of not less than 1,000.

2. The photosensitive plate of claim 1, wherein the actinic ray absorbent comprises a UV-absorbing microparticle having an average particle size of 1 nm–500 nm.

3. The photosensitive plate of claim 2, wherein the UV-absorbing microparticle is obtained by emulsion polymerization of a UV absorbent.

4. The photosensitive plate of claim 1, wherein the coating layer has a thickness of not more than 1 μm, and a peel force between the coating layer and the cover film is 1 g/cm-100 g/cm.

5. The photosensitive plate of claim 1, wherein the coating layer has a light transmittance of 50%–99% of the light having a wavelength of 360 nm.

* * * * *